(12) United States Patent
Jeong et al.

(10) Patent No.: US 10,512,171 B2
(45) Date of Patent: Dec. 17, 2019

(54) LAMINATED BODY COMPRISING METAL WIRE LAYER, AND MANUFACTURING METHOD THEREFOR

(71) Applicant: LG CHEM, LTD., Seoul (KR)

(72) Inventors: Hye Won Jeong, Daejeon (KR); Bo Ra Shin, Daejeon (KR); Kyungjun Kim, Daejeon (KR); Ji Eun Myung, Daejeon (KR); Yong Goo Son, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/540,191

(22) PCT Filed: Jun. 8, 2016

(86) PCT No.: PCT/KR2016/006019
§ 371 (c)(1),
(2) Date: Jun. 27, 2017

(87) PCT Pub. No.: WO2016/200122
PCT Pub. Date: Dec. 15, 2016

(65) Prior Publication Data
US 2018/0007799 A1 Jan. 4, 2018

(30) Foreign Application Priority Data

Jun. 8, 2015 (KR) .................. 10-2015-0080282
Jun. 1, 2016 (KR) .................. 10-2016-0068102

(51) Int. Cl.
*B32B 3/00* (2006.01)
*H05K 3/38* (2006.01)
(Continued)

(52) U.S. Cl.
CPC ........... *H05K 3/386* (2013.01); *B32B 15/088* (2013.01); *C08G 73/10* (2013.01);
(Continued)

(58) Field of Classification Search
None
See application file for complete search history.

(56) References Cited

U.S. PATENT DOCUMENTS 9,345,123 B2  5/2016  Yang et al.
9,611,358 B2  4/2017  Jeong et al.
(Continued)

FOREIGN PATENT DOCUMENTS

CN  104379339 A  2/2015
EP  2832536 A1  2/2015
(Continued)

OTHER PUBLICATIONS

Office Action issued for Japanese patent application No. 2017-533961 dated Jul. 24, 2018, 2 pages.
(Continued)

*Primary Examiner* — Seth Dumbris
(74) *Attorney, Agent, or Firm* — Rothwell, Figg, Ernst & Manbeck, P.C.

(57) ABSTRACT

The present invention relates to a method for producing a metal wire embedded flexible substrate from a laminate structure. The laminate structure includes a carrier substrate, a debonding layer disposed on at least one surface of the carrier substrate and including a polyimide resin, a metal wiring layer disposed in contact with the debonding layer, and a flexible substrate layer disposed in contact with the metal wiring layer. The adhesion strength between the metal wiring layer and the flexible substrate layer is greater than that between the metal wiring layer and the debonding layer. According to the method of the present invention, the flexible substrate with the metal wiring layer can be easily separated from the carrier substrate even without the need for other processes, such as laser and light irradiation. The embedding of the metal wires in the flexible substrate layer decreases the sheet resistance of an electrode and can protect (Continued)

the metal wires from damage or disconnection even when the flexible substrate is deformed in shape.

20 Claims, 7 Drawing Sheets

(51) Int. Cl.

| | | |
|---|---|---|
| *H05K 3/10* | (2006.01) | |
| *C08G 73/10* | (2006.01) | |
| *H05K 1/02* | (2006.01) | |
| *B32B 15/088* | (2006.01) | |
| *H05K 1/03* | (2006.01) | |

(52) U.S. Cl.
CPC ............ *C08G 73/1007* (2013.01); *H05K 1/02* (2013.01); *H05K 1/03* (2013.01); *H05K 3/103* (2013.01); *H05K 3/38* (2013.01); *H05K 2203/016* (2013.01); *Y10T 428/24917* (2015.01)

(56) References Cited

U.S. PATENT DOCUMENTS

| | | | |
|---|---|---|---|
| 10,035,883 B2 | 7/2018 | Jeong et al. | |
| 2002/0159242 A1* | 10/2002 | Nakatani | H01L 21/561 |
| | | | 361/760 |
| 2010/0051178 A1* | 3/2010 | Lee | B32B 37/025 |
| | | | 156/152 |
| 2014/0000943 A1 | 1/2014 | Kang et al. | |
| 2014/0076610 A1 | 3/2014 | Yang et al. | |
| 2015/0210048 A1* | 7/2015 | Jeong | B32B 7/06 |
| | | | 428/212 |
| 2015/0239210 A1 | 8/2015 | Jeong et al. | |
| 2018/0334541 A1 | 11/2018 | Jeong et al. | |

FOREIGN PATENT DOCUMENTS

| | | | | |
|---|---|---|---|---|
| EP | 2985143 A1 | | 2/2016 | |
| EP | 2985144 A1 | | 2/2016 | |
| JP | 2005-136318 A | | 5/2005 | |
| JP | 2011020399 | * | 2/2011 | ............ B32B 27/34 |
| KR | 10-0731856 B1 | | 6/2007 | |
| KR | 10-2010-0027526 A | | 3/2010 | |
| KR | 10-1191865 B1 | | 10/2012 | |
| KR | 10-2013-0046150 A | | 5/2013 | |
| KR | 10-2014-0038141 A | | 3/2014 | |
| KR | 10-2014-0122207 A | | 10/2014 | |
| WO | WO2006067280 | * | 6/2006 | ............... H05K 3/20 |
| WO | 2014-168400 A1 | | 10/2014 | |

OTHER PUBLICATIONS

Office Action issued for Chinese patent application No. 201680006096.X dated Jul. 27, 2018, 8 pages.
European Search Report issued for European patent application No. 16807 762.6 dated Jul. 3, 2018, 7 pages.
Search Report issued for International Application No. PCT/KR2016/006019 dated Sep. 20, 2016 (3 pages).

* cited by examiner

[Fig. 1a]
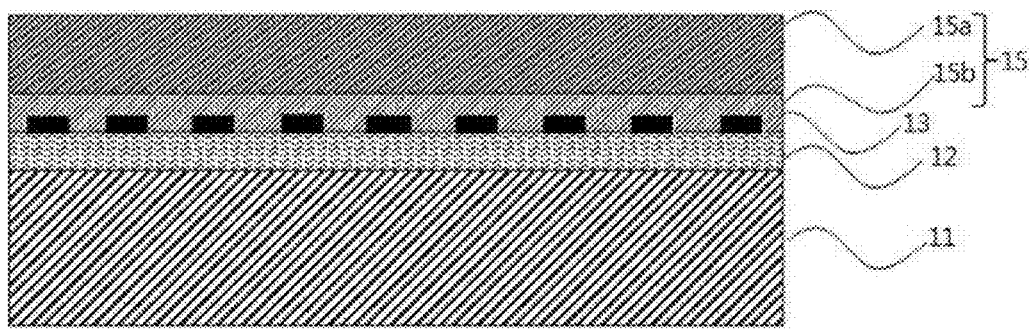
[Fig. 1b]
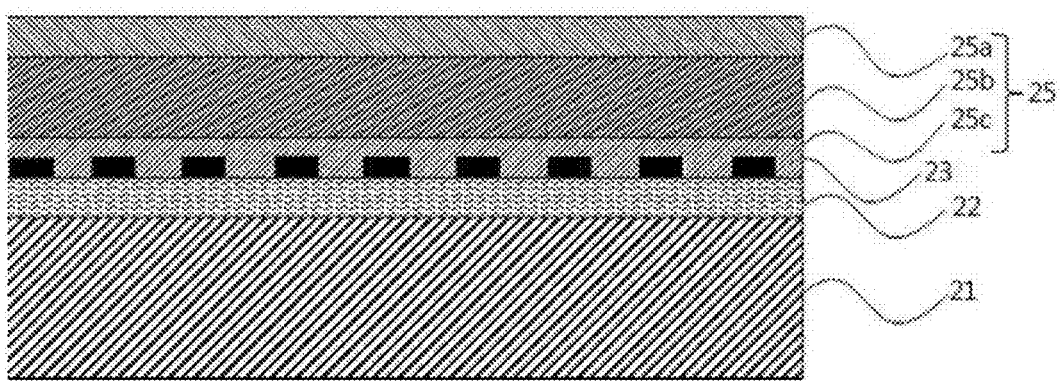

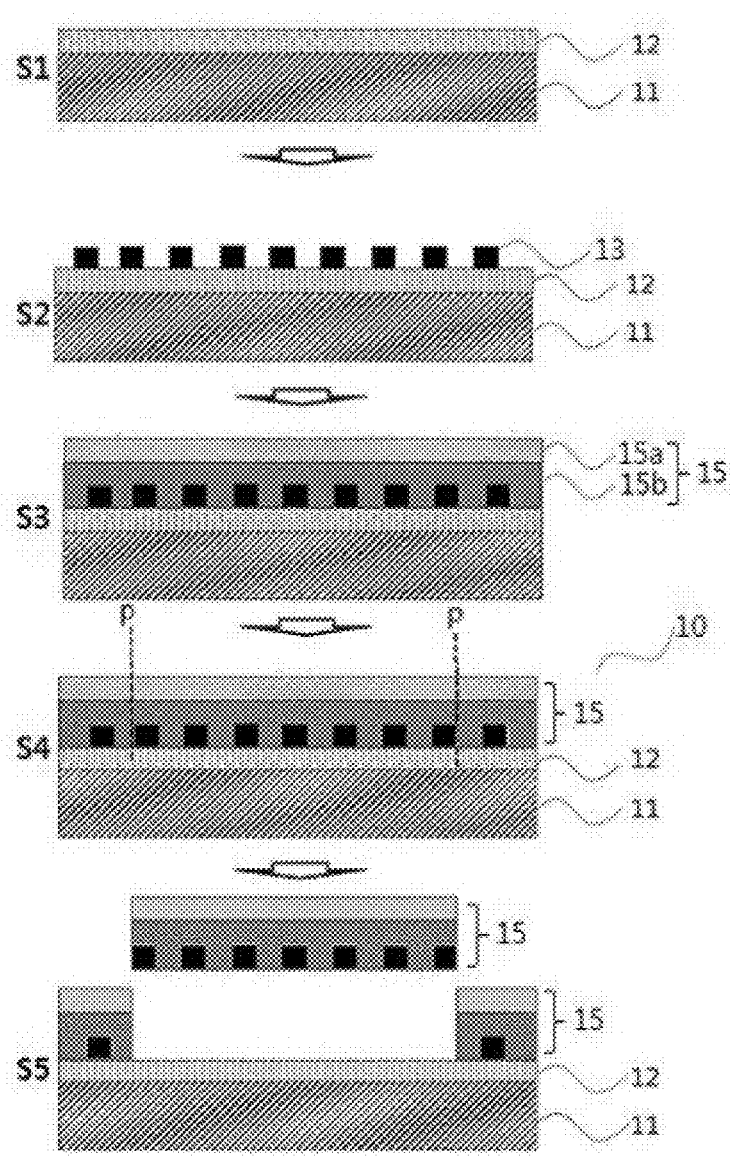
[Fig. 2]

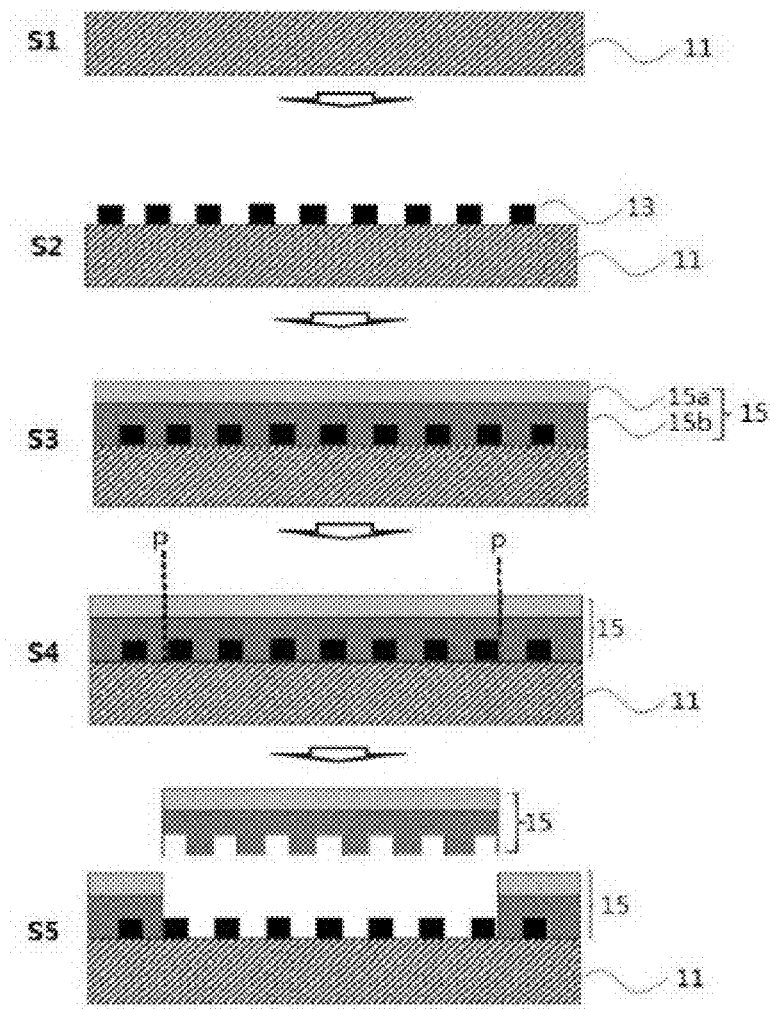
[Fig. 3]

[Fig. 4a]
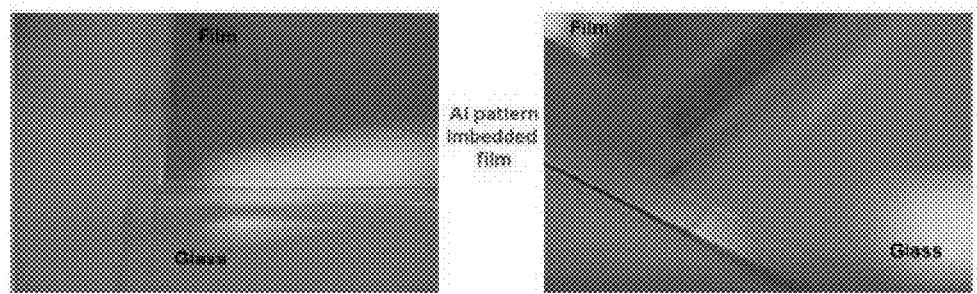
[Fig. 4b]
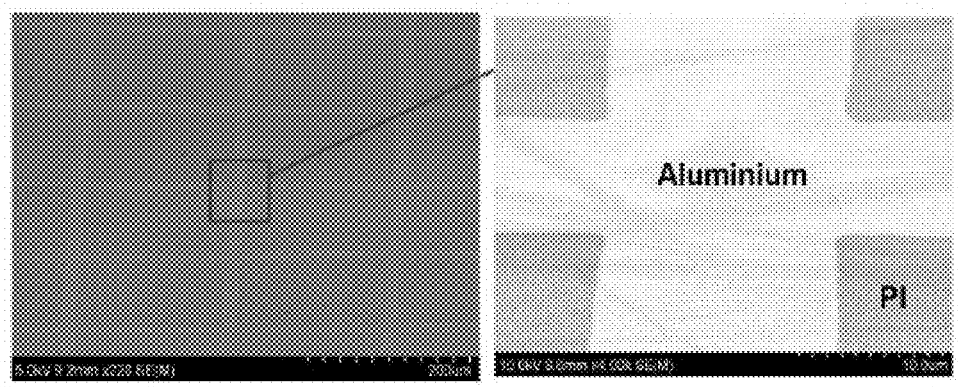
[Fig. 4c]
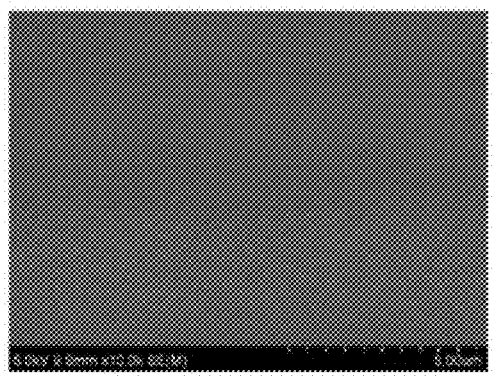

[Fig. 5a]
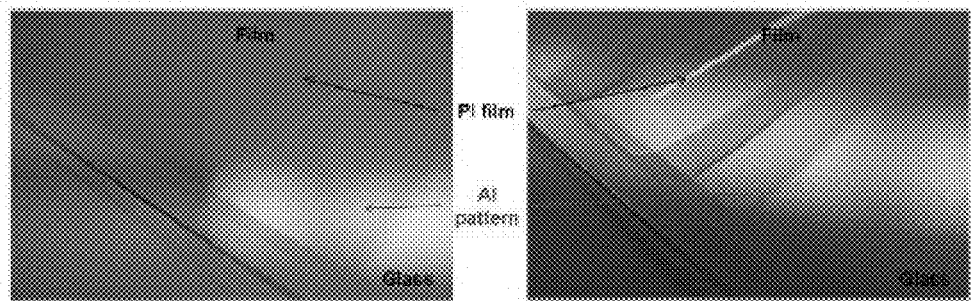
[Fig. 5b]
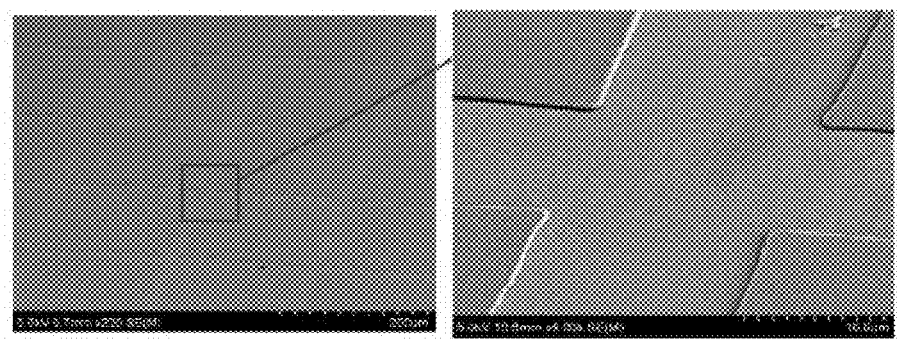
[Fig. 5c]
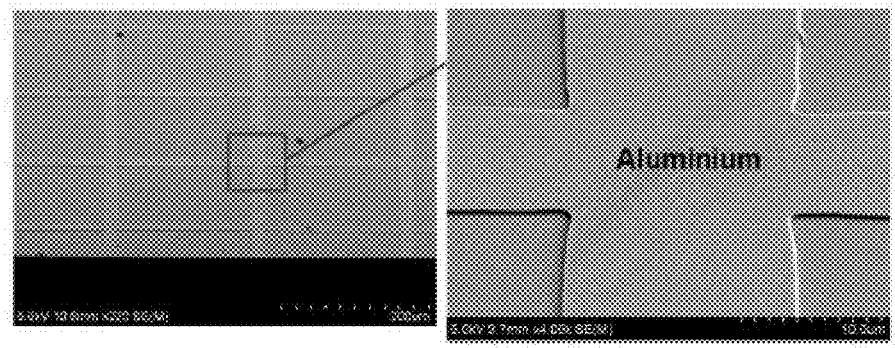

[Fig. 6a]
(a) 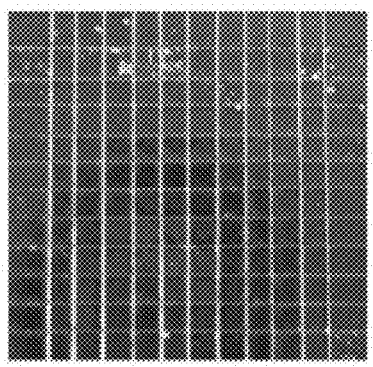 (b) 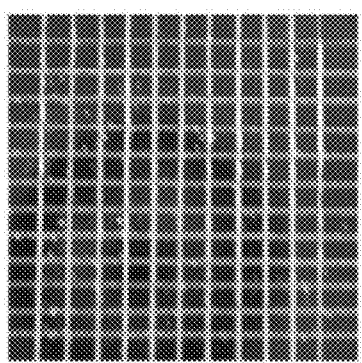
[Fig. 6b]
(a) 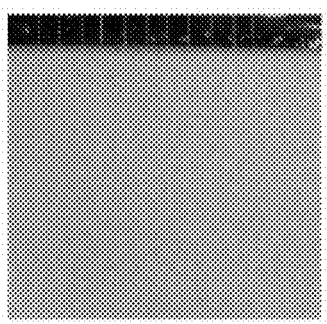 (b) 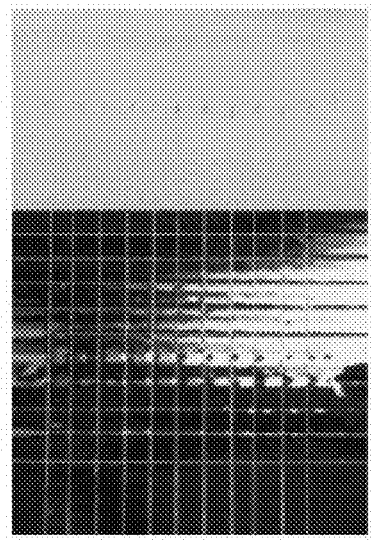

[Fig. 6c]
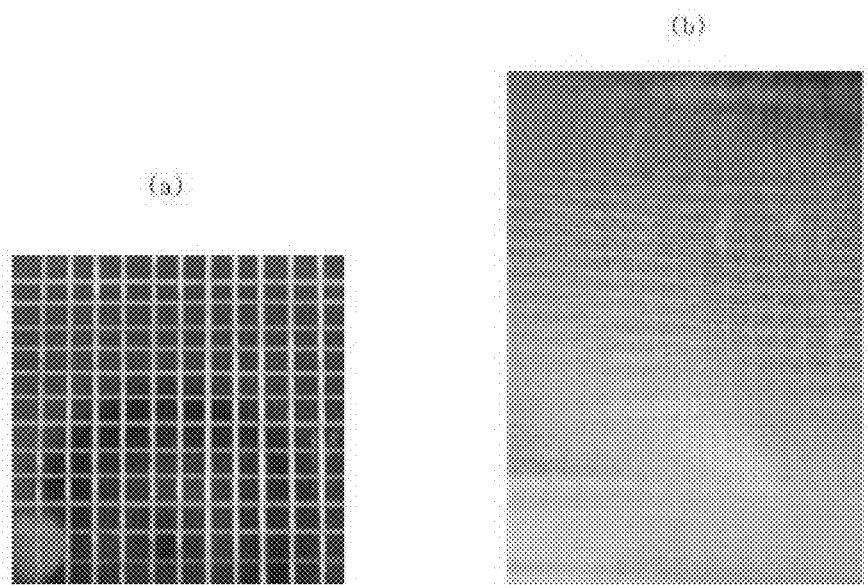

LAMINATED BODY COMPRISING METAL
WIRE LAYER, AND MANUFACTURING
METHOD THEREFOR

CROSS-REFERENCE TO RELATED
APPLICATIONS

This application is a 35 U.S.C. § 371 National Phase Entry Application from PCT/KR2016/006019, filed on Jun. 8, 2016, and designating the United States, which claims priority under 35 U.S.C. § 119 to Korean Patent Application No. 10-2015-0080282 filed on Jun. 8, 2015, and Korean Patent Application No. 10-2016-0068102 filed on Jun. 1, 2016, with the Korean Intellectual Property Office, the disclosures of which are herein incorporated by reference in their entirety.

BACKGROUND OF THE INVENTION

1. Field of the Invention

The present invention relates to a laminate structure from which a metal wire embedded substrate is produced. More specifically, the present invention relates to a laminate structure in which a metal wire embedded substrate layer as a flexible substrate is easily separated from a carrier substrate, enabling the fabrication of a device (for example, a flexible display device) having the flexible substrate in an easier manner.

2. Description of the Related Art

Flexible electronics, for example, flexible displays, solar cells, area lighting devices, e-papers, flexible secondary batteries, and touch panels, have recently received attention as promising technologies.

Flexible electronics have developed to make inexpensive, easy-to-bend, and transparent electronic devices and systems. Techniques for producing flexible substrates including transparent electrodes with low resistance are essentially needed to realize flexible electronics.

Several approaches are known to reduce the resistance of metal wires, for example, (1) by reducing the resistivity ($\rho$) of the wires, (2) by decreasing the length of the wires, or (3) by increasing the height (thickness) of the wires.

For approach (1), however, resistivity limits the choice of materials. Copper is presently the most widely used material due to its sufficiently low resistivity. Other materials, such as silver, are only available at high prices, limiting their use. Approach (2) is physically limited by the problems associated with the circuit design described in Korean Patent Publication No. 10-2014-0008606. In view of the limitations of approaches (1) and (2), approach (3) is considered acceptable. However, as the height of wires increases, many problems arise, for example, disordered alignment of the wires, electrical shorting, short circuiting between the wires, and damage to the wires.

Thus, there is a need to insert metal wires into a substrate. In this connection, conventional techniques include etching techniques for forming a desired pattern of metal wires by deposition and etching and damascene techniques for damascening wires into grooves formed in an insulating film by applying CMP to a film, such as a copper (Cu) thin film, which is difficult to dry etch for patterning.

However, such conventional techniques require consumption of large amounts of materials by repeated deposition/etching, involve complicated processing steps, and cause thermal damage to a plastic substrate upon thermal treatment of a metal layer formed in the plastic substrate.

To solve the above problems, a proposal has been made on a technique wherein metal wires are formed on a hard substrate, a curable polymer is coated and cured thereon, and the hard substrate is mechanically peeled. However, according to this technique, when the hard substrate is forcibly peeled from the metal wire embedded polymer substrate, damage to the metal wires and the polymer substrate is caused, leading to defects in a final product. Portions of the hard substrate remain unremoved from the polymer substrate and act as impurities.

Under such circumstances, a method has been proposed in which a water or organic solvent soluble or photodegradable sacrificial layer is formed on a carrier substrate, a metal wire embedded flexible substrate layer is formed on the sacrificial layer, and the sacrificial layer is removed to separate and recover the flexible substrate from the carrier substrate (Korean Patent Publication No. 10-2014-0028243). According to this method, however, removal of the sacrificial layer by dissolution in water or an organic solvent or photodecomposition increases the costs associated with the treatment of the water or organic solvent after use.

SUMMARY OF THE INVENTION

It is one object of the present invention to provide a laminate structure from which a metal wire embedded flexible substrate can be easily produced without deposition and etching, and a flexible substrate produced from the laminate structure.

It is a further object of the present invention to provide an electronic device including the metal wire embedded flexible substrate.

One aspect of the present invention provides a laminate structure including a carrier substrate, a debonding layer disposed on at least one surface of the carrier substrate and including a polyimide resin, a metal wiring layer disposed in contact with the debonding layer, and a flexible substrate layer disposed in contact with the metal wiring layer wherein the adhesion strength between the metal wiring layer and the flexible substrate layer is greater than that between the metal wiring layer and the debonding layer.

According to one embodiment, the metal wiring layer includes a plurality of metal wires and the flexible substrate layer surrounds the metal wires and is in contact with the debonding layer to embed the metal wires therein.

According to one embodiment, a physical stimulus may be applied to change the adhesion strength between the debonding layer and the flexible substrate with the metal wiring layer such that the cross-sections of the metal wiring layer and the flexible substrate layer are exposed without causing chemical changes in the debonding layer, and when the adhesion strengths of the debonding layer to the metal wiring layer before and after application of the physical stimulus are defined as A1 and A2, respectively, the ratio A2/A1 may be from 0.001 to 0.5.

The debonding layer may have a peel strength not greater than 0.3 N/cm from the metal wiring layer after application of the physical stimulus.

The debonding layer may have an adhesion strength of at least 1 N/cm to the metal wiring layer before application of the physical stimulus.

The debonding layer may have a thickness of 0.05 to 5 µm.

The metal wires may be formed by inkjet printing, gravure printing, gravure offset printing, aerosol printing, screen printing, electroplating, vacuum deposition or photolithography.

The metal wires may be arranged at intervals of 0.05 to 50 mm.

The metal wires may be composed of silver (Ag), copper (Cu), aluminum (Al), gold (Au), platinum (Pt), nickel (Ni), titanium (Ti), molybdenum (Mo) or an alloy thereof.

The polyimide resin may be prepared by reacting an aromatic tetracarboxylic dianhydride of Formula 1:

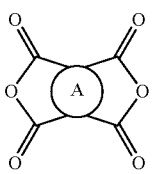

(1)

wherein A is a tetravalent aromatic organic group of Formula 2a or 2b:

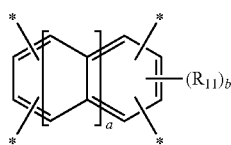

(2a)

wherein $R_{11}$ is a $C_1$-$C_4$ alkyl or $C_1$-$C_4$ haloalkyl group, a is an integer from 0 to 3, and b is an integer from 0 to 2,

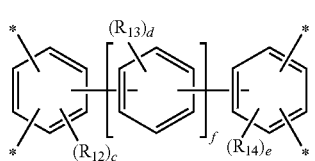

(2b)

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to give a polyamic acid, and curing the polyamic acid at a temperature of 200° C. or above.

The aromatic diamine compound may be represented by Formula 4a or 4b:

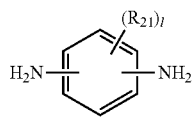

(4a)

wherein $R_{21}$ is a $C_1$-$C_{10}$ alkyl or $C_1$-$C_{10}$ haloalkyl group and l is an integer from 0 to 4,

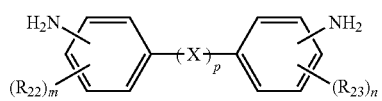

(4b)

wherein $R_{22}$ and $R_{23}$ are each independently a $C_1$-$C_{10}$ alkyl or $C_1$-$C_{10}$ haloalkyl group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2O$]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, l, m and n are each independently an integer from 0 to 4, and p is an integer of 0 or 1.

The flexible substrate layer may be formed of at least one curable polymer resin selected from the group consisting of polyethylene terephthalate (PET), polyethylene sulfone (PES), polyethylene naphthalate (PEN), polycarbonate (PC), polymethylmethacrylate (PMMA), polyimide (PI), polyetherimide (PEI), polyamideimide, polyester, ethylene vinyl acetate (EVA), polyether amide imide, polyester amide imide, polyarylate (PAR), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolefin polymers (COPs), cycloolefin copolymers (COCs), dicyclopentadiene (DCPD) polymers, cyclopentadiene (CPD) polymers, polydimethylsiloxane (PDMS), silicone resins, fluoride resins, and modified epoxy resins.

A further aspect of the present invention provides a method for producing a flexible substrate with a metal wiring layer, including preparing a carrier substrate, forming a debonding layer including a polyimide resin on the carrier substrate, forming a metal wiring layer on the debonding layer, coating a curable polymer on the metal wiring layer formed on the debonding layer to form a flexible substrate layer, and separating the flexible substrate with the metal wiring layer from the carrier substrate by the application of a physical stimulus such that the cross-sections of the metal wiring layer and the flexible substrate are exposed without causing chemical changes in the debonding layer.

According to one embodiment, the physical stimulus is selected from cutting, laser cutting, and diamond scribing.

The physical stimulus may be greater than 0 N but not greater than 0.1 N.

Another aspect of the present invention provides an electronic device including the flexible substrate with the metal wiring layer.

According to one embodiment, the electronic device may be selected from the group consisting of solar cells, organic light emitting diode lighting devices, semiconductor devices, and display devices.

The display devices may be flexible organic electroluminescent devices.

Details of other embodiments according to various aspects of the invention are included in the following description.

The flexible substrate with the metal wiring layer can be easily separated from the carrier substrate by the application of a relatively small physical stimulus, such as cutting, eliminating the need for laser or light irradiation or dissolution. Therefore, the use of the laminate structure enables the fabrication of a device (for example, a flexible display device) including the flexible substrate in an easier manner.

Thus, there is no need for additional processing, such as laser or light irradiation or dissolution, contributing to the simplification of the device fabrication process and the reduction of the fabrication cost. In addition, the device can be prevented from deterioration of reliability and occurrence of defects caused by laser or light irradiation. The embedding of the metal wires in the substrate decreases the sheet resistance of a transparent electrode and can protect the metal wires from damage or disconnection even when the flexible substrate is deformed in shape, making the flexible substrate suitable for use in a flexible device.

BRIEF DESCRIPTION OF THE DRAWINGS

FIG. 1a is a schematic cross-sectional view illustrating the structure of a laminate structure according to one embodiment of the present invention and FIG. 1b is a schematic cross-sectional view illustrating the structure of a laminate structure according to a further embodiment of the present invention;

FIG. 2 schematically illustrates a method for producing a flexible substrate according to one embodiment of the present invention;

FIG. 3 schematically illustrates a comparative method for producing a flexible substrate;

FIG. 4a shows a flexible substrate film produced in Example 1, FIG. 4b shows the surface of the flexible substrate film, and FIG. 4c shows the surface of a carrier substrate after removal of the flexible substrate;

FIG. 5a shows a flexible substrate film produced in Comparative Example 1, FIG. 5b shows the surface of the flexible substrate film, and FIG. 5c shows the surface of a carrier substrate after removal of the flexible substrate; and FIGS. 6a to 6c are photographs showing the detachability of flexible substrates produced in Example 2 and Comparative Example 2 before and after a tape test.

DETAILED DESCRIPTION OF THE INVENTION

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

It will be understood that when an element such as a layer, membrane, film or substrate is referred to as being "above" or "on" another element, it can be directly on the other element or one or more intervening elements may also be present. It will also be understood that when an element such as a layer, membrane, film or substrate is referred to as being "under" another element, it can be directly under the other element or one or more intervening elements may also be present.

Unless otherwise mentioned, the term "physical stimulus" used herein is intended to include mechanical stimuli such as peeling, cutting, friction, tension and compression causing no chemical changes, and it refers to a stimulus by which the cross-sections of a laminate structure can be exposed regardless of what means or mode is employed. In some cases, the physical stimulus may have a strength greater than 0 N but not greater than 0.1 N per unit area. That is, the application of the physical stimulus means that the cross-sections of a laminate structure are exposed regardless of what means is used. Preferably, the physical stimulus is applied in such a manner that two or more cross-sections of a laminate structure forming the end portions of a flexible substrate are exposed at predetermined intervals.

As used herein, the term "adhesion strength" refers to the adhesion strength of a debonding layer to a flexible substrate before application of the physical stimulus, and the term "peel strength" refers to the adhesion strength of a debonding layer to a flexible substrate after application of the physical stimulus.

The present invention provides a laminate structure including a carrier substrate, a debonding layer disposed on at least one surface of the carrier substrate and including a polyimide resin, a metal wiring layer disposed in contact with the debonding layer, and a flexible substrate layer disposed in contact with the metal wiring layer wherein the adhesion strength between the metal wiring layer and the flexible substrate layer is greater than that between the metal wiring layer and the debonding layer.

According to one embodiment, the metal wiring layer includes a plurality of metal wires and the flexible substrate layer surrounds the metal wires and is in contact with the debonding layer to embed the metal wires therein.

According to one embodiment, a physical stimulus may be applied to change the adhesion strength between the debonding layer and the flexible substrate with the metal wiring layer such that the cross-sections of the metal wiring layer and the flexible substrate layer are exposed without causing chemical changes in the debonding layer, and when the adhesion strengths of the debonding layer to the metal wiring layer before and after application of the physical stimulus are defined as A1 and A2, respectively, the ratio A2/A1 may be from 0.001 to 0.5.

The debonding layer may have a peel strength not greater than 0.3 N/cm from the flexible substrate and/or may have an adhesion strength of at least 1 N/cm to the flexible substrate after application of the physical stimulus.

The present invention also provides a device substrate produced from the laminate structure.

The present invention also provides a device including the device substrate.

A more detailed description will now be given concerning a laminate structure, a method for producing the laminate structure, a device substrate produced from the laminate structure, a method for producing the device substrate, a device including the device substrate, and a method for fabricating the device according to embodiments of the present invention.

Specifically, the flexible substrate layer formed on the debonding layer and including the metal wiring layer can be easily peeled from the laminate structure by a physical stimulus. Therefore, the flexible substrate can be separated from the debonding layer even without the need for other processes, such as laser and light irradiation, for removal of a sacrificial layer formed between the carrier substrate and the substrate layer. This enables the production of the wire embedded flexible substrate in an easier manner.

The debonding layer is disposed in contact with the metal wiring layer. In the case where the metal wiring layer is patterned and the metal wires are embedded in the flexible substrate, the debonding layer may be partially in contact with the flexible substrate. That is, the debonding layer may be in contact with the metal wiring layer and optionally the flexible substrate layer.

Specifically, the application of the physical stimulus to expose the cross-sections of the metal wiring layer and the flexible substrate reduces the adhesion strength of the debonding layer to the metal wiring layer and/or the flexible substrate. More specifically, the debonding layer has an adhesion strength of at least 1 N/cm to the metal wiring layer and/or the flexible substrate before application of the physical stimulus but has a peel strength not greater than 0.3 N/cm from the metal wiring layer and/or the flexible substrate after application of the physical stimulus. The physical stimulus is applied such that the cross-sections of the metal wiring layer and the flexible substrate are exposed without causing chemical changes in the debonding layer and may have a strength greater than 0 N but not greater than 0.1 N.

Specific examples of methods for applying the physical stimulus to expose the cross-sections of the metal wiring layer and/or the flexible substrate, but are not limited to, cutting, laser cutting, and diamond scribing.

The physical stimulus is not limited so long as the cross-sections of the metal wiring layer and the flexible substrate are exposed. For example, the physical stimulus may be applied to expose the cross-sections of the flexible substrate and the debonding layer or the cross-sections of the flexible substrate, the debonding layer, other functional layers and optionally the carrier substrate, in addition to the cross-sections of the metal wiring layer and the flexible substrate.

The present inventors have found that when a debonding layer including a polyimide resin with particular characteristics is disposed on a carrier substrate, a metal wiring layer is formed on the debonding layer, and subsequently a polymer layer is coated to form a flexible substrate, the metal wires and the polymer layer can be easily separated from the debonding layer simply by the application of a physical stimulus without the need for laser or light irradiation, enabling the production of the flexible substrate with the metal wiring layer and facilitating the fabrication a display device using the flexible substrate. Such functions and effects are thought to be attributed to the following characteristics of the polyimide resin.

The metal wire embedded flexible substrate can function to decrease the sheet resistance of a transparent electrode, achieving improved efficiency of an electronic device. Particularly, the flexible substrate can be used to fabricate a solar cell with improved power conversion efficiency. The use of the flexible substrate can prevent a large-area solar cell from losing its power conversion efficiency. The metal wires embedded in the substrate can be protected from damage or disconnection even when a device including the metal wires is deformed in shape. This makes the substrate suitable for use in a flexible display.

FIGS. 1a and 1b are schematic cross-sectional views illustrating the structures of laminate structures according to embodiments of the present invention. These figures are merely illustrative and the present invention is not limited thereto.

Referring to FIGS. 1a and 1b, the laminate structure 10 or 20 may include a carrier substrate 11 or 21, a debonding layer 12 or 22 disposed on one surface of the carrier substrate and including a polyimide resin, a flexible substrate layer 15 or 25 disposed on the debonding layer 12 or 22 and including a polymer layer 15b or 25c in which metal wires 13 or 23 are embedded, and a transparent electrode layer disposed on thin film glass layer 15a or 25a. A physical stimulus is applied to change the adhesion strength between the debonding layer 12 or 22 and the flexible substrate layer 15 or 25 or the metal wiring layer 13 or 23 such that the cross-sections of the flexible substrate 15 or 25 or the metal wiring layer 13 or 23 are exposed without causing chemical changes in the debonding layer 12 or 22.

Below is a more detailed discussion of the embodiments.

The carrier substrate 11 may be any one that is used to support the flexible substrate 15 such that a device can be easily fabricated on the laminate structure 10. Specific examples of suitable carrier substrates include glass substrates, metal substrates such as stainless steel substrates, and multilayer structures thereof. Particularly preferred is a glass substrate that is most easily applicable to the fabrication of a device.

The carrier substrate 11 may be pretreated by etching, for example, corona treatment under an ozone atmosphere, flame treatment, sputtering, UV irradiation or e-beam irradiation. This pretreatment increases the adhesion of the carrier substrate to the debonding layer.

The thickness and size of the carrier substrate 11 may be suitably selected depending on the kind of a device to which the laminate is to be applied. The thickness of the carrier substrate 11 is preferably in the range of 0.1 to 50 mm taking into consideration the transparency of the substrate. Within this range, the mechanical strength of the carrier substrate 11 is sufficiently high to support the flexible substrate.

The debonding layer 12 including a polyimide resin is disposed on at least one surface of the carrier substrate 11.

The imidization degree of the polyimide resin included in the debonding layer 12 is controlled to an appropriate range, which will be described below. The debonding layer exhibits an adhesion strength above a predetermined level so as to appropriately fix and support the flexible substrate 15 in a subsequent process for fabricating a device including forming a device structure on the flexible substrate 15. However, after the device fabrication process is completed, the adhesion strength of the debonding layer to the flexible substrate 15 can be reduced by a simple physical stimulus such as cutting without laser or light irradiation or dissolution, and hence, the debonding layer 12 can be easily separated from the flexible substrate 15.

Specifically, when the adhesion strengths of the debonding layer 12 to the metal wiring layer 13 or the flexible substrate 15 before and after the application of a physical stimulus are defined as A1 and A2, respectively, the ratio A2/A1 is from 0.001 to 0.5, preferably from 0.001 to 0.1. The debonding layer 12 can be easily separated from the flexible substrate 15 with the metal wiring layer by a simple physical stimulus such as cutting without laser or light irradiation.

More specifically, the debonding layer 12 exhibits an adhesion strength of at least about 1 N/cm, at least about 2 N/cm, or about 3 to about 5 N/cm to the metal wiring layer 13 or the flexible substrate 15 before application of the physical stimulus but can exhibit a peel strength of about 0.3 N/cm or less, for example, about 0.2 N/cm or less, about 0.1 N/cm or less, or about 0.001 to 0.05 N/cm from the metal wiring layer 13 or the flexible substrate 15 after application of the physical stimulus.

The peel strength of the debonding layer 12 can be measured under the conditions shown in Table 1.

TABLE 1

| Conditions for peel strength measurement | Film width (mm) | 10 |
| --- | --- | --- |
| | Film length (mm) | 100 |
| | Rate (mm/min) | 50 |
| | Tester | Texture Analyzer (TA.XT plus, Stable micro systems) |
| | Peel angle (°) | 90 |

Specifically, the peel strength can be determined by the following procedure. First, a debonding layer, a metal wiring layer, and a flexible substrate are sequentially formed on a glass substrate to prepare a laminate structure as a sample. A physical stimulus is applied to cut the sample into a rectangular shape having a width of 10 mm. The force required to detach the flexible substrate at an angle of 90° from the debonding layer while holding one end of the flexible substrate is measured using the tester under the conditions shown in Table 1. This force is defined as the peel strength of the debonding layer.

The adhesion strength can be determined by the following procedure. First, a debonding layer and a flexible substrate are sequentially formed on a glass substrate to prepare a 100 mm wide laminate structure as a sample. A 10 mm wide tape was attached to one end of the flexible substrate. The force required to detach the tape at an angle of 90° from the debonding layer while holding one end of the tape is measured. This force is defined as the adhesion strength of the debonding layer. A tester and conditions for measuring the force may be the same as those for the peel strength measurement shown in Table 1.

The desired adhesion strength and peel strength of the debonding layer 12 can be achieved by the imidization degree of the polyimide resin included in the debonding layer. The imidization degree can be controlled by various factors, for example, the kind and content of monomers for the polyimide resin and the imidization conditions (such as heat treatment temperature and time).

As an example, the polyimide resin included in the debonding layer 12 may have an imidization degree of about 60% to about 99%, about 70% to 98% or about 75% to 96%. Within this range, the debonding layer 12 can meet the requirements in terms of adhesion strength and peel strength, and hence, the flexible substrate 15 with the metal wiring layer can be easily separated from the debonding layer 12 even when a physical stimulus is applied without the need for laser or light irradiation. The imidization degree of the polyimide resin can be defined as the percentage of the integrated intensity of the CN bands observed at 1350 to 1400 $cm^{-1}$ in the IR spectrum after a composition including a polyimide precursor, for example, a polyamic acid resin, is applied and imidized at a temperature of about 200° C. or above with respect to the integrated intensity (100%) of the CN bands observed in the same wavelength range after the composition is imidized at a temperature of about 500° C. or above.

The imidization degree range of the polyimide resin can be achieved by controlling the temperature condition for curing the polyamic acid resin.

As a result of experiments conducted by the present inventors, it was confirmed that the curing temperature conditions for the preparation of the polyimide resin, the imidization degree of the polyimide resin layer, and the peel strength of the polyimide resin layer can satisfy the relationships shown in Table 2.

TABLE 2

| | Curing temperature (° C.) | | | | |
|---|---|---|---|---|---|
| | 150 | 200 | 250 | 300 | 350 | 500 |
| Imidization degree (%) | 10.36 | 49.21 | 79.34 | 92.69 | 95.69 | 100 |
| Peel strength (N/cm) | 2.8 | 2.8 | 0.03 | 0.016 | 0.03 | 0.35 |

As shown in Table 2, when the debonding layer is formed by applying a composition including a polyamic acid resin as a precursor of the polyimide resin to the carrier substrate and curing the composition at a temperature of about 200° C. or above or 250° C. to 500° C., the debonding layer has a peel strength not greater than about 0.3 N/cm and the polyimide resin included in the debonding layer has an imidization degree of about 60% to about 99%, about 70% to about 98%, or about 75% to about 96%. The use of the laminate structure according to this embodiment markedly simplifies a process for the fabrication of a device (e.g., a flexible display device) including the flexible substrate, which has already been described above.

The polyimide resin prepared under the control of the curing temperature may have a glass transition temperature of at least about 200° C., at least about 300° C., or about 350° C. to about 500° C. and a decomposition temperature (Td) of at least 400° C. or 400° C. to 600° C. Due to good heat resistance of the polyimide resin, the debonding layer is highly resistant to high temperature during processing for the fabrication of a device and can be prevented from warpage in the course of fabricating a device on the laminate structure. In addition, the debonding layer can prevent the reliability of a device from deteriorating. As a result, the use of the debonding layer enables the fabrication of a device with improved characteristics and high reliability. Specifically, the debonding layer of the laminate structure according to this embodiment may have a coefficient of thermal expansion (CTE) not higher than about 30 ppm/° C., not higher than about 25 ppm/° C., not higher than about 20 ppm/° C. or from about 1 to about 17 ppm/° C. at a temperature of 100 to 200° C. and a 1% thermal decomposition temperature (Td1%) of at least 450° C. or at least 470° C.

The debonding layer 12 meeting the requirements in terms of structural and physical properties is completely peeled from the flexible substrate 15 and thus has no influence on the transparency and optical properties of a device substrate.

A polyamic acid resin as a precursor of the polyimide resin may be prepared by polymerizing a tetracarboxylic dianhydride compound and a diamine compound as monomers. The polyimide resin may be prepared by imidization of the polyamic acid resin.

Specific examples of tetracarboxylic dianhydride compounds suitable as monomers include pyromellitic dianhydride (PMDA), 3,3',4,4'-biphenyltetracarboxylic dianhydride (BPDA), meso-butmetal wiring layerane-1,2,3,4-tetracarboxylic dianhydride, 3,3',4,4'-benzophenone tetracarboxylic dianhydride (BTDA), 2,3,3',4'-diphenylether tetracarboxylic dianhydride, (ODPA), 3,3',4,4'-diphenylsulfone tetracarboxylic dianhydride (DSDA), 4,4'-(hexafluoroisopropylidene)diphthalic anhydride, 3,3',4,4'-biphenyltetracarboxylic dianhydride (S-BPDA), 1,2,3,4-cyclobutane tetracarboxylic dianhydride, 1,2-dimethyl-1,2,3,4-cyclobutane tetracarboxylic dianhydride, 1,2,3,4-tetramethyl-1,2,3,4-cyclobutane tetracarboxylic dianhydride, 1,2,3,4-cyclopentane tetracarboxylic dianhydride, 1,2,4,5-cyclohexane tetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-en-2,3,5,6-tetracarboxylic dianhydride, 2,3,4,5-tetrahydrofuran tetracarboxylic dianhydride, 3,5,6-tricarboxy-2-norbornane acetic dianhydride, and derivatives thereof. It should be understood that other various tetracarboxylic dianhydrides may also be used.

Specific examples of diamine compounds suitable as monomers include: aromatic diamines, such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'- methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(4-aminophenoxy)phenyl]propane (6H MDA), 2,2'-bis(trifluoromethyl)benzidine (TFMB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4-(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F), and 4,4'-oxydianiline (ODA); and aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-aminopropyl)piperazine, 3,9-bis(3-aminopropyl)-2,4,8,10-tetraoxaspiro[5.5]-undecane, and 1,3-bis(3-aminopropyl)tetramethyldisiloxane.

There is no particular restriction on the kinds of the tetracarboxylic dianhydride and the diamine compound, but it is important for the acid dianhydride to have no linker structure between aromatic rings in order to more appropriately meet the requirements of the debonding layer in terms of physical properties, for example, low CTE range and peel strength described above. The tetracarboxylic dianhydride is preferably an aromatic tetracarboxylic dianhydride of Formula 1:

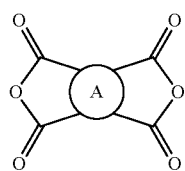

(1)

wherein A is a tetravalent aromatic organic group derived from an acid dianhydride, specifically a tetravalent aromatic organic group of Formula 2a or 2b:

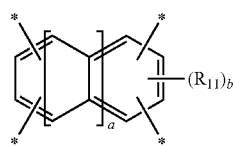

(2a)

wherein $R_{11}$ is a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, a is an integer from 0 to 3, and b is an integer from 0 to 2, preferably 0,

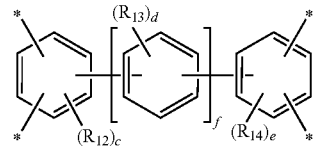

(2b)

wherein $R_{12}$ to $R_{14}$ are each independently a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, c and e are each independently an integer from 0 to 3, preferably 0, d is an integer from 0 to 4, preferably 0, and f is an integer from 0 to 3.

Particularly, the tetracarboxylic dianhydride is more preferably pyromellitic dianhydride (PMDA) of Formula 3a or 3,3',4,4'-biphenyltetracarboxylic dianhydride (BPDA) of Formula 3b:

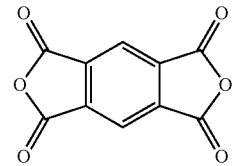

(3a)

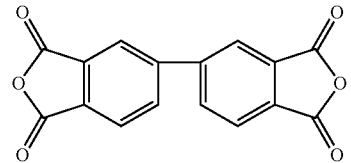

(3b)

In the compound of Formula 3b, the structure is linear and the two aromatic rings are directly connected without a linker structure.

As the packing density of the debonding layer 12 increases, the intermolecular space decreases and it is thus difficult for the molecules to interpenetrate, resulting in low bonding strength. As a consequence, the adhesion strength of the debonding layer 12 to the overlying flexible substrate 15 is reduced and the peel strength of the flexible substrate from the laminate structure is also reduced. The packing density can be represented by CTE. The higher the packing density, the lower the CTE value, and vice versa. Accordingly, it is preferred that the diamine compound is an aromatic diamine compound having a linear structure, specifically, an aromatic diamine compound of Formula 4a or 4b:

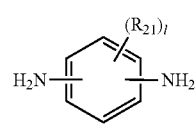

(4a)

wherein $R_{21}$ is a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group and l is an integer from 0 to 4, preferably 0,

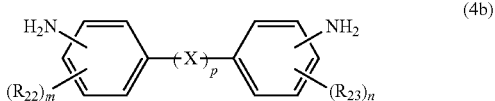

(4b)

wherein $R_{22}$ and $R_{23}$ are each independently a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2$O]$_q$—, $C_6$-$C_{18}$ monocyclic and polycyclic cycloalkylene (for example, cyclohexylene and norbornene) groups, $C_6$-$C_{18}$ monocyclic and polycyclic arylene (for example, phenylene and naphthalene) groups, and combinations thereof, $R_{24}$ and $R_{25}$ are each independently selected from the group consisting of a hydrogen atom, $C_1$-$C_{10}$ alkyl (for example, methyl, ethyl and propyl) groups, and $C_1$-$C_{10}$ haloalkyl (for example, fluoromethyl, bromomethyl, chloromethyl and trifluoromethyl) groups, q is an integer of 1 or 2, m and n are each independently an integer from 0 to 4, preferably 0, and p is an integer of 0 or 1, preferably 0.

The use of the aromatic diamine compound more appropriately meets the requirements of the debonding layer in terms of physical properties.

Examples of preferred aromatic diamine compounds include p-phenylenediamine (PDA), benzidine (BZD), m-tolidine, and 2,2'-bis(trifluoromethyl)benzidine (TFMB).

These monomers are polymerized in a polar organic solvent to prepare the desired polyamic acid resin. The polyamic acid resin is subjected to imidization at the curing temperature described above in the presence or absence of an imidization catalyst such as an amine catalyst to prepare the polyimide resin. The debonding layer including the polyimide resin can meet the requirements in terms of physical properties. Conditions other than the curing temperature for the preparation of the polyamic acid resin or the polyimide resin can be controlled by suitable methods well known to those skilled in the art, and a further explanation thereof is thus omitted.

The debonding layer 12 may have a thickness of 0.05 to 5 μm, 0.05 to 4 μm, 0.05 to 3 μm, 0.05 to 2 μm, or 0.05 to 1 μm. As the debonding layer decreases in thickness, its adhesion strength to the carrier substrate increases. However, an excessively small thickness of the debonding layer leads to an increase in the adhesion strength of the debonding layer to the flexible substrate, resulting in poor detachability of the debonding layer from the flexible substrate. Within the thickness range defined above, high adhesion strength of the debonding layer to the carrier substrate and good detachability of the debonding layer from the flexible substrate are ensured.

In the laminate structure, the metal wiring layer 13 embedded in the polymer layer 15b forming the flexible substrate is disposed on the debonding layer 12.

The metal wires 13 may be formed by coating or depositing a suitable metal or alloy, such as silver (Ag), copper (Cu), aluminum (Al), gold (Au), platinum (Pt), nickel (Ni), titanium (Ti), molybdenum (Mo) or an alloy thereof, or at least one conductive metal oxide selected from indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), and aluminum zinc oxide-silver-aluminum zinc oxide (AZO-Ag-AZO) on the debonding layer 12 by a suitable technique, such as inkjet printing, gravure printing, gravure offset printing, aerosol printing, electroplating, vacuum deposition, thermal deposition, sputtering or e-beam deposition. Any suitable material that is electrically conductive enough to reduce the sheet resistance of an electrode may be used without limitation.

The metal wiring layer 13 are arranged in parallel, preferably at intervals of 0.05 to 50 mm, in the polymer layer 15b of the flexible substrate 15.

If the metal wires 13 are densely arranged at intervals of less than 0.05 mm, a rise in processing cost may be inevitable. Meanwhile, if the metal wires are arranged at intervals exceeding 50 mm, the role of the metal wires as auxiliary electrodes may be negligible, failing to effectively reduce the sheet resistance of electrodes in contact with the metal wires.

The width of the metal wires 13 is preferably from 0.5 to 1000 μm. If the metal wires have a width of less than 0.5 μm, a complicated process is required for micropatterning and the resistance of the metal wires increases. Meanwhile, if the metal wires have a width exceeding 1000 μm, the transmittance of the flexible substrate decreases.

The metal wires 13 may be used as auxiliary electrodes in an electronic device including the flexible substrate. In solar cells, organic light emitting diode lighting devices, semiconductor devices, and display devices, exposed portions of the metal wires 13 are brought into direct contact with transparent electrodes disposed on the substrate to reduce the sheet resistance of the transparent electrodes. However, the mode of contact between the metal wires 13 and the transparent electrodes is not limited. Also in the case where the metal wires are wholly embedded in the flexible substrate, auxiliary means may be used to connect the metal wires as auxiliary electrodes to the transparent electrodes.

The flexible substrate 15 may include a structure selected from the group consisting of the thin film glass layer 15a, the polymer layer 15b, and a multilayer laminate thereof.

Any glass material that is used in general display devices may be used as a material for the thin film glass layer 15a of the flexible substrate 15. Specific examples of materials suitable for the thin film glass layer include soda lime glass, neutral borosilicate glass, and non-alkali glass. The material for the thin film glass layer is suitably selected depending on a device where it is to be applied. Non-alkali glass is preferably applied to a device requiring a low coefficient of thermal shrinkage, and soda lime glass with high visible light transmittance is preferably applied to a device requiring high transparency.

More preferably, the above materials are mixed in appropriate amounts such that the thin film glass layer has an average coefficient of thermal expansion at 25 to 200° C. (hereinafter referred to simply as an "average coefficient of thermal expansion") of 0 to 200×10$^{-7}$/° C., preferably 0 to 50×10$^{-7}$/° C., and a visible light transmittance of at least 90%. When the average coefficient of thermal expansion of the thin film glass layer 15a is in the range defined above, device elements formed on a heated substrate of a device can be prevented from dislocation upon cooling.

The thin film glass layer 15a may be formed in accordance with any suitable method known in the art. Specifically, the thin film glass layer 15a can be formed by mixing glass raw materials, melting the mixture, shaping the molten mixture into a plate, and cutting the plate to a suitable size. The shaping may be performed by a float process, a slot down-draw process, an overflow down-draw process, a fusion process, a redraw process, or a roll-out process.

The dimensions (for example, thickness and size) of the thin film glass layer 15a may be suitably selected depending on the kind of a device to which the laminate structure is to be applied. Preferably, the thin film glass layer 15a has a thickness in the range of 10 to 200 μm taking into consideration the transparency of a device substrate. Within this range, the thin film glass layer 15a can exhibit high flexibility together with proper mechanical strength.

The polymer layer 15b may be formed on or under the thin film glass layer 15a. Alternatively, polymer layers 15b may be formed on both surfaces of the thin film glass layer 15a. The thin film glass layer 15a may be pretreated by etching, for example, corona treatment under an ozone atmosphere, flame treatment, sputtering, UV irradiation or e-beam irradiation. This pretreatment increases the adhesion of the thin film glass layer 15a to the polymer layer 15b.

A material for the polymer layer 15b of the flexible substrate 15 is not particularly limited and may be any polymer that is known to be applicable to general substrates of flexible devices. Specifically, the polymer layer 15b may include at least one polymer resin selected from the group consisting of polyethylene terephthalate (PET), polyethylene sulfone (PES), polyethylene naphthalate (PEN), polycarbonate (PC), polymethylmethacrylate (PMMA), polyimide (PI), polyetherimide (PEI), polyamideimide, polyester, ethylene vinyl acetate (EVA), polyether amide imide, polyester amide imide, polyarylate (PAR), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolef in polymers (COPs), cycloolef in copolymers (COCs), dicyclopentadiene (DCPD) polymers, cyclopentadiene (CPD) polymers, polydimethylsiloxane (PDMS), silicone resins, fluoride resins, and modified epoxy resins.

A polyimide resin is particularly preferred as the material for the polymer layer. Specifically, the polyimide resin may have an imidization degree of about 50 to about 99% or about 70 to about 95%, a glass transition temperature (Tg) of at least about 200° C., at least about 300° C. or about 350 to 500° C., and a decomposition temperature (Td) of at least 400° C. or 400 to 600° C. Such good heat resistance of the polyimide resin eliminates the risk that the polymer layer 15b may be deformed during subsequent heating for the production of the laminate structure or a device substrate, and leads to improvements in the heat resistance of the substrate and a device. Specifically, the polymer layer 15b may have a coefficient of thermal expansion (CTE) of about 60 ppm/° C. or less, about 50 ppm/° C. or less, about 40 ppm/° C. or less, or about 1 to 30 ppm/° C. at 100 to 200° C., and a 1% thermal decomposition temperature (Td1%) of 450° C. or more or 470° C. or more.

The polyimide resin included in the polymer layer 15b may also be prepared by polymerization of an acid dianhydride and a diamine compound as monomers to prepare a polyamic acid resin and curing the polyamic acid resin. The polymer layer 15b may be formed by drying a composition in the form of a solution including the polyimide resin. The acid dianhydride and the diamine compound are the same as those described in the preparation of the polyimide resin for the formation of the debonding layer.

For the preparation of the polyimide resin meeting the requirements in terms of physical properties, it is preferred to appropriately control the kinds and ratio of the monomers for the polyimide resin and the imidization conditions. As an example, it is preferred to appropriately control the ratio of an acid dianhydride and a diamine during polymerization in order to meet the requirements of the polymer layer 15b in terms of physical properties. Specifically, it would be desirable that to use the diamine in an amount of 0.8 to 1.2 moles or 0.9 to 1.1 moles per mole of the tetracarboxylic dianhydride.

The polymer layer 15b having the above physical properties may have a thickness of 0.5 to 50 μm, 1 to 50 μm, 2 to 50 μm, 3 to 50 μm, or 3 to 30 μm. Particularly, when the polymer layer 15b is in contact with the debonding layer, it is preferable that the polymer layer 15b has an optimum thickness. For example, the thickness of the polymer layer 15b may be 10 to 500 times, 20 to 400 times, 30 to 300 times, or 50 to 200 times larger than that of the debonding layer.

According to one embodiment, the flexible substrate 15 of the laminate structure may include the thin film glass layer 15a and the polymer layer 15b, each of which is in the form of a monolayer. Alternatively, each of the thin film glass layer 15a and the polymer layer 15b may be formed in plurality. That is, the flexible substrate 15 may include a multilayer structure in which two or more layers of thin film glass layers 15a and two or more layers of polymer layers 15b are laminated. The laminate structure 10 according to this embodiment of the present invention includes the flexible substrate having a bilayer structure in which the polymer layer 15b is laminated under the thin film glass layer 15a, as illustrated in FIG. 1a. A further embodiment of the present invention provides a laminate structure 20 illustrated in FIG. 1b. The laminate structure 20 includes a flexible substrate 25 having a trilayer structure in which polymer layers 25b, 25c are formed on both surfaces of a thin film glass layer 25a. However, the laminate structure of the present invention is not limited to this multilayer structure. In the flexible substrate having a multilayer structure, the polymer layer 25b formed on the thin film glass layer 25a may serve as a protective film for the thin film glass layer.

Referring to FIG. 2, the laminate structure 10 having the above structure may be produced in accordance with a method including the following steps: (S1) forming a debonding layer 12 including a polyimide resin on at least one surface of a carrier substrate 11; (S2) forming metal wires on the debonding layer 12; and (S3) forming a flexible substrate 15 including a polymer layer coated on the metal wires.

Hereinafter, the individual steps will be explained in detail. In S1, a debonding layer 12 is formed on a carrier substrate 11.

The carrier substrate 11 is the same as that described above. Before formation of the debonding layer 12, the carrier substrate 11 may be pretreated by etching, for example, corona treatment under an ozone atmosphere, flame treatment, sputtering, UV irradiation or e-beam irradiation. This pretreatment increases the adhesion of the carrier substrate to the debonding layer.

The debonding layer 12 may be formed by applying a composition including a polyimide resin or a polyamic acid resin as a precursor of the polyimide resin to the carrier substrate 11 and curing the composition at a temperature of 200° C. or above. During the curing, imidization of the polyamic acid resin proceeds.

The polyimide resin and the polyamic acid resin included in the composition for the formation of the debonding layer are the same as those explained above.

The composition for the formation of the debonding layer may further include at least one additive selected from binders, solvents, cross-linkers, initiators, dispersants, plasticizers, viscosity modifiers, UV absorbers, photosensitive monomers, and sensitizers, which are commonly used in polyimide resin layers.

The composition may be applied by any suitable technique known in the art. Specific examples of techniques suitable for the application of the composition include spin coating, dip coating, and bar coating. Casting, rolling or spray coating may be suitably used for a continuous process.

Before the curing, drying may be further performed to remove organic solvents present in the composition for the formation of the debonding layer. The composition may be dried by any suitable technique known in the art. Specifically, the composition may be dried at a temperature of 140° C. or below.

The curing may be performed by heat treatment at a temperature of at least 200° C. or a temperature of 250° C. to 500° C. This heat treatment may also be performed in multiple stages at various temperatures within the temperature range defined above.

The curing time is not particularly limited and may be, for example, in the range of 3 to 30 minutes.

After the curing, heat treatment may be optionally further performed.

The subsequent heat treatment is preferably performed at a temperature of at least 300° C. for 1 to 30 minutes. The heat treatment may be performed only once. Alternatively, the heat treatment may be performed twice or more in multiple stages. For example, the heat treatment may be performed in three stages: first heat treatment at 200 to 250° C., second heat treatment at 300 to 350° C., and third heat treatment at 400 to 450° C.

In S2, metal wires 13 and a flexible substrate 15 are formed on the debonding layer 12 to produce the laminate structure.

The flexible substrate 15 is the same as that described above. The flexible substrate 15 may be a laminate of a thin film glass layer 15a and a polymer layer 15b, which may be formed by any suitable method known in the art.

For example, the flexible substrate 15 may have a bilayer structure in which the polymer layer 15b including a polyimide resin is formed under the thin film glass layer 15a. In this case, the flexible substrate 15 may be formed by applying a composition including a polyamic acid resin to the debonding layer 12, curing the composition by heating at a temperature of 200° C. or above to form the polymer layer 15b, disposing the thin film glass layer 15a on the polymer layer 15b, and heat treating the resulting structure at a temperature of 200 to 300° C. for lamination. Alternatively, a composition including a polyamide resin may be used instead of the composition including a polyamic acid resin. In this case, the polymer layer 15b may be formed by drying the composition including a polyamide resin.

Compositions for the formation of the polymer layers may further include at least one additive commonly used in the art. Examples of such additives include binders, solvents, cross-linkers, initiators, dispersants, plasticizers, viscosity modifiers, UV absorbers, photosensitive monomers, and sensitizers.

The curing may also be performed in multiple stages at various temperatures within the temperature range defined above.

In the laminate structure thus produced, the debonding layer exhibits an appropriate adhesion strength to the flexible substrate and can thus properly fix and support the flexible substrate in a subsequent process for the fabrication of a device. Accordingly, the use of the laminate structure according to this embodiment of the present invention facilitates the production of a substrate of a device (e.g., a flexible display device) including the flexible substrate. In addition, a process for the fabrication of a device can be appropriately carried out on the laminate structure even without the need for laser or light irradiation for the separation of the flexible substrate, to fabricate a device with excellent characteristics. As a result, the fabrication process of the device having the flexible substrate can be simplified and the fabrication cost can also be reduced.

A further embodiment of the present invention provides a device substrate produced using the laminate structure and a method for producing the device substrate.

The device substrate may be produced by a method including the following steps: forming a debonding layer including a polyimide resin on one surface of a carrier substrate; forming metal wires on the debonding layer and coating a curable resin on the metal wires to form a flexible substrate; and applying a physical stimulus to the flexible substrate such that the cross-sections of the flexible substrate are exposed without causing chemical changes in the debonding layer, to separate the flexible substrate from the carrier substrate on which the debonding layer is formed. The steps of forming the debonding layer and the flexible substrate are the same as those described above.

FIG. 2 schematically illustrates a process for the production of a device substrate according to one embodiment of the present invention. FIG. 2 is merely illustrative and the invention is not limited thereto.

Referring to FIG. 2, the device substrate of the present invention may be produced by a method including the following steps: (S1) forming a debonding layer including a polyimide resin on at least one surface of a carrier substrate; (S2) forming metal wires on the debonding layer; (S3) coating a curable resin on the metal wires to form a flexible substrate; and (S4 and S5) applying a physical stimulus p to the flexible substrate and separating the flexible substrate from the carrier substrate on which the debonding layer is formed. The flexible substrate may be separated by a general method used in the art. For example, a suction method may be used to separate the flexible substrate but the present invention is not limited thereto. Any method may be selected that requires a much smaller force than conventional methods to minimize damage to a display device during fabrication.

The steps prior to the step of separating the flexible substrate in the method for producing the device substrate may be the same as those of the method for producing the laminate structure.

The flexible substrate may be separated by applying a suitable physical stimulus such as cutting, laser cutting or diamond scribing such that the cross-sections of the metal wire embedded flexible substrate are exposed without causing chemical changes in the debonding layer. Specifically, a physical stimulus greater than 0 N but not greater than 0.1 N may be applied to separate the flexible substrate.

According to this method, the metal wire embedded flexible substrate can be separated from the carrier substrate by the application of a relatively small physical stimulus such as cutting even without the need for further processing such as laser or light irradiation or dissolution. Accordingly, the use of the flexible substrate can prevent a device from deterioration of physical properties by laser or light irradiation and deterioration of reliability or occurrence of defects caused by chemical changes. The embedding of the metal wires in the substrate leads to an improvement in electrical properties, such as low contact sheet resistance with an electrode laminated or assembled on the substrate, and can protect the metal wires from disconnection, electrical shorting, and damage even when the flexible substrate is deformed in shape, making the flexible substrate suitable for use in a flexible device.

Thus, a further embodiment of the present invention provides a device including the device substrate.

Specifically, the device may be a flexible display device such as a solar cell having a flexible substrate (for example, a flexible solar cell), an organic light emitting diode (OLED) lighting device having a flexible substrate (for example, a flexible OLED lighting device), a semiconductor device having a flexible substrate, an organic electroluminescent device having a flexible substrate, an electrophoresis device having a flexible substrate or an LCD device having a flexible substrate. An organic electroluminescent device is particularly preferred.

The device may be fabricated by a method including the following steps: sequentially forming a debonding layer including a polyimide resin, a metal wiring layer, and a flexible substrate on at least one surface of a carrier substrate to obtain a laminate structure; forming a device structure on the flexible substrate of the laminate structure (i.e. the step of fabricating a device); and applying a physical stimulus without laser or light irradiation such that the cross-sections of the flexible substrate layer are exposed without causing chemical changes in the debonding layer, to separate the flexible substrate on which the device structure is formed.

The device structure may vary depending on the kind of the device to be fabricated on the flexible substrate. The device structure may be a general one, for example, a semiconductor device structure including a gate electrode, a display device structure including a thin film transistor array, a diode device structure having a P/N junction, an OLED structure including an organic light emitting layer, or a solar cell structure. As an example, the device structure may be an organic electroluminescent device structure including: a transparent electrode disposed at the back side of the flexible substrate where the metal wires are exposed and including, for example, indium tin oxide (ITO); a light emitting part disposed at the back side of the transparent electrode and including an organic compound; and a metal electrode disposed at the back side of the light emitting part and including a metal, for example, aluminum.

As described above, the device of the present invention can be fabricated in a simple manner at greatly reduced cost because there is no need for laser or light irradiation. In addition, the device of the present invention can be prevented from deterioration of reliability or occurrence of defects caused by laser or light irradiation. Furthermore, the embedding of the metal wires in the substrate decreases the sheet resistance of the transparent electrode, leading to an improvement in the efficiency of the device, and can protect the metal wires from damage or disconnection even when the flexible substrate is deformed in shape, making the flexible substrate suitable for use in a flexible device.

Hereinafter, embodiments of the present invention will be explained in detail such that the invention can be easily carried out by a person having ordinary knowledge in the art. The invention may, however, be embodied in many different forms and should not be construed as being limited to the embodiments set forth herein.

EXAMPLE 1

Production of Laminate Structure and Flexible Substrate 1 mol of BPDA was polymerized with 0.99 mol of PDA to prepare a polyamic acid resin. A composition including 3 wt % of the polyamic acid resin and 97 wt % of DMAc as a solvent was applied to one surface of non-alkali glass as a carrier substrate such that the thickness after drying was 0.1 μm. The resulting coating was continuously dried at a temperature of 120° C. and cured at a temperature of 300° C. (for 30 min) to form a debonding layer including a polyimide resin (hereinafter, referred to as a 'first polyimide resin').

Aluminum was deposited to a thickness of 200 nm on the debonding layer and was micropatterned by printing. Specifically, a resist ink was coated on the entire surface of a silicone blanket and then a cliché engraved with a micropattern was brought into contact with the blanket to form a pattern on the silicone blanket. Subsequently, portions of the coating were removed to form a micropattern on the silicone blanket. The resist ink micropattern formed on the silicone blanket was transferred to an aluminum-deposited debonding layer formed on a glass substrate and dried in an oven at 115° C. for 3 min to remove the solvent remaining in the resist pattern. The resist patterned aluminum substrate was etched with an etchant by spraying at 45° C. The etchant was cleaned off with deionized water, followed by drying. The remaining resist ink was removed using a stripper to form aluminum wires on the debonding layer.

1 mol of BPDA was polymerized with 0.99 mol of TFMB to prepare a polyamic acid resin. A composition including 12 wt % of the polyamic acid resin and 88 wt % of DMAc as a solvent was applied (cast) to the aluminum wires formed on the debonding layer such that the thickness after drying was 15 μm. The resulting coating was continuously dried at a temperature of 100° C. and cured at a temperature of 350° C. for 60 min to form a polymer layer including a polyimide resin (hereinafter, referred to as a 'second polyimide resin'). The resulting laminate had a structure in which the carrier substrate, the debonding layer including the BPDA-PDA polyimide resin, and the polymer layer including the BPDA-TFMB polyimide resin as a flexible substrate were sequentially disposed.

A physical stimulus was applied to the laminate structure such that the cross-sections of the flexible substrate layer were exposed without causing chemical changes in the debonding layer. By the physical stimulus, the laminate structure was cut to a size of 10 mm (w)×100 mm (l) and a depth such that the debonding layer was cut but the carrier substrate remained uncut. After a pressure sensitive adhesive tape (adhesion strength 43±6 g/mm) was attached to the laminate structure, the metal wire embedded flexible substrate layer was separated from the debonding layer in such a manner that the tape was detached while holding its ends.

The production of the laminate structure including the debonding layer and the separation of the flexible substrate are illustrated in FIG. 2. FIGS. 4a to 4c show surface images of the metal wire embedded flexible substrate and the carrier substrate.

COMPARATIVE EXAMPLE 1

Production of Laminate Structure and Flexible Substrate

Metal wires were formed on one surface of non-alkali glass as a carrier substrate in the same manner as described in Example 1, except that a debonding layer was not formed. 1 mol of BPDA was polymerized with 0.99 mol of TFMB to prepare a polyamic acid resin. A composition including 12 wt % of the polyamic acid resin and 88 wt % of DMAc as a solvent was applied (cast) to the metal wires such that the thickness after drying was 15 μm. The resulting coating was continuously dried at a temperature of 100° C. and cured at a temperature of 350° C. for 60 min to form a polymer layer including a polyimide resin (hereinafter, referred to as a 'second polyimide resin') as a flexible layer. The resulting laminate had a structure in which the carrier substrate, metal wires, and the metal wire embedded flexible were sequentially disposed.

In the same manner as described in Example 1, the laminate structure was cut to a size of 10 mm (w)×100 mm (l) and a depth such that the carrier substrate remained uncut. After a pressure sensitive adhesive tape (adhesion strength 43±6 g/mm) was attached to the laminate structure, the metal wire embedded flexible substrate layer was separated from the debonding layer in such a manner that the tape was detached while holding its ends.

The production of the laminate structure without a debonding layer and the separation of the flexible substrate from the carrier substrate layer are illustrated in FIG. 3. FIGS. 5a to 5c show surface images of the flexible substrate and the carrier substrate.

FIG. 4a shows the flexible substrate film produced in Example 1. The flexible substrate film was formed on the debonding layer. As shown in FIG. 4a, the metal wires were formed on the film separated from the carrier substrate. In contrast, FIG. 5a shows the flexible substrate with the metal wires on the carrier substrate produced in Comparative Example 1. A debonding layer was not formed on the flexible substrate film. As shown in FIG. 5a, when the flexible substrate was separated, the metal wires were not attached to the film and remained on the carrier substrate.

FIG. 4b shows the surface of the exposed metal wires of the flexible film separated from the debonding layer and FIG. 4c shows the surface of the debonding layer. The results of FIGS. 4b and 4c indicate that the flexible substrate including the metal wires was readily separated from the debonding layer.

In contrast, FIGS. 5b and 5c reveal that the flexible substrate was not readily separated by the physical stimulus due to the absence of a debonding layer and the metal wires remained on the carrier substrate after separation of the flexible substrate.

EXAMPLE 2

1 mol of BPDA was polymerized with 0.99 mol of PDA to prepare a polyamic acid resin. A composition including 3 wt % of the polyamic acid resin and 97 wt % of DMAc as a solvent was applied to one surface of non-alkali glass as a carrier substrate such that the thickness after drying was 0.1 μm. The resulting coating was continuously dried at a temperature of 120° C. and cured at a temperature of 300° C. (for 30 min) to form a debonding layer including a polyimide resin (hereinafter, referred to as a 'first polyimide resin').

Aluminum was deposited to a thickness of 200 nm on the entire surface of the debonding layer by sputtering.

1 mol of BPDA was polymerized with 0.99 mol of TFMB to prepare a polyamic acid resin. A composition including 12 wt % of the polyamic acid resin and 88 wt % of DMAc as a solvent was applied (cast) to the aluminum deposited debonding layer such that the thickness after drying was 15 μm. The resulting coating was continuously dried at a temperature of 100° C. and cured at a temperature of 350° C. for 60 min to form a polymer layer including a polyimide resin (hereinafter, referred to as a 'second polyimide resin').

COMPARATIVE EXAMPLE 2

Aluminum was deposited to a thickness of 200 nm on the entire surface of a non-alkali glass substrate as a carrier substrate by sputtering.

1 mol of BPDA was polymerized with 0.99 mol of TFMB to prepare a polyamic acid resin. A composition including 12 wt % of the polyamic acid resin and 88 wt % of DMAc as a solvent was applied (cast) to the aluminum deposited substrate such that the thickness after drying was 15 μm. The resulting coating was continuously dried at a temperature of 100° C. and cured at a temperature of 350° C. for 60 min to form a polymer layer including a polyimide resin (hereinafter, referred to as a 'second polyimide resin').

Adhesion Strength Testing

Each of the flexible substrates of the laminate structures produced in Example 2 and Comparative Example 2 was patterned such that 10 (w)×10 (l) (a total of 100) square lattices, each having a size of 1 mm×1 mm, were formed. The central portion of a pressure sensitive adhesive tape (width 1 inch, length ~3 inches, adhesion strength 43±6 g/mm) was attached to the lattice pattern. The tape was firmly attached to the lattice pattern by rubbing with an eraser 10 times.

After standing for 60 sec, the tape was detached in the 180° direction for 2 sec while holding its ends. The peel performance was scored based on the following criteria:
Score 5: None of the lattices were peeled
Score 4: 5% or less of the lattices were peeled
Score 3: 5-15% of the lattices were peeled
Score 2: 15-35% of the lattices were peeled
Score 1: 35-65% of the lattices were peeled
Score 0: 65% or more of the lattices were peeled A higher score indicates higher adhesion strength between the carrier substrate and the flexible substrate layer with the aluminum layer.

FIG. 6a shows the substrates of (a) Example 2 and (b) Comparative Example 2 before the tape test. As a result of the test, all lattices were peeled in the sample of Example 2 (score 0) and none of the lattices were peeled in the sample of Comparative Example 2 (score 5). FIG. 6b shows photographs of the surfaces of the glass substrate (a) and the tape (b) after the tape test was conducted on the substrate of Example 2. FIG. 6c shows photographs of the surfaces of the glass substrate (a) and the tape (b) after the tape test was conducted on the substrate of Comparative Example 2.

From these experimental results, it can be concluded that the formation of the debonding layer facilitates peeling of the flexible substrate with the metal layer from the carrier substrate and enables the embedding of the metal wires in the flexible substrate layer, thus being advantageous in achieving thinness of electronic devices.

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

What is claimed is:

1. A laminate structure comprising a carrier substrate, a debonding layer disposed on at least one surface of the carrier substrate and comprising a polyimide resin, a metal wiring layer disposed in contact with the debonding layer, and a flexible substrate layer disposed in contact with the metal wiring layer wherein the adhesion strength between the metal wiring layer and the flexible substrate layer is greater than that between the metal wiring layer and the debonding layer, wherein the polyimide resin forming the debonding layer is prepared by reacting an aromatic tetracarboxylic dianhydride of Formula 1:

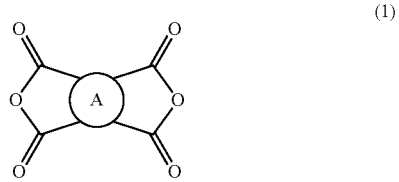

wherein A is a tetravalent aromatic organic group of Formula 2a or 2b:

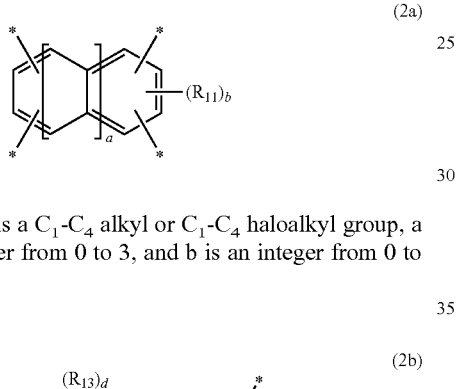

wherein $R_{11}$ is a $C_1$-$C_4$ alkyl or $C_1$-$C_4$ haloalkyl group, a is an integer from 0 to 3, and b is an integer from 0 to 2, and wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to give a polyamic acid, and curing the polyamic acid at a temperature of 200° C. or above.

2. The laminate structure according to claim 1, wherein the debonding layer has a thickness of 0.05 to 5 μm.

3. The laminate structure according to claim 1, wherein the metal wiring layer comprises a plurality of metal wires and the flexible substrate layer surrounds the metal wires and is in contact with the debonding layer to embed the metal wires therein.

4. The laminate structure according to claim 3, wherein the metal wires are arranged at intervals of 0.05 to 50 mm.

5. The laminate structure according to claim 1, wherein a physical stimulus is applied to change the adhesion strength between the debonding layer and the flexible substrate with the metal wiring layer such that the cross-sections of the metal wiring layer and the flexible substrate layer are exposed without causing chemical changes in the debonding layer, and when the adhesion strengths of the debonding layer to the metal wiring layer before and after application of the physical stimulus are defined as A1 and A2, respectively, the ratio A2/A1 is from 0.001 to 0.5.

6. The laminate structure according to claim 5, wherein the debonding layer has a peel strength not greater than 0.3 N/cm from the metal wiring layer after application of the physical stimulus.

7. The laminate structure according to claim 5, wherein the debonding layer has an adhesion strength of at least 1 N/cm to the metal wiring layer before application of the physical stimulus.

8. The laminate structure according to claim 1, wherein the metal wires are composed of silver (Ag), copper (Cu), aluminum (Al), gold (Au), platinum (Pt), nickel (Ni), titanium (Ti), molybdenum (Mo) or an alloy thereof.

9. The laminate structure according to claim 1, wherein the aromatic diamine compound is represented by Formula 4a or 4b:

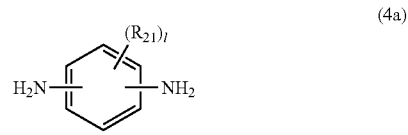

wherein $R_{21}$ is a $C_1$-$C_{10}$ alkyl or $C_1$-$C_{10}$ haloalkyl group and l is an integer from 0 to 4,

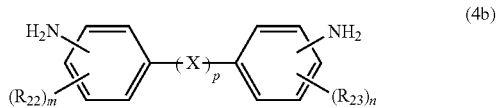

wherein $R_{22}$ and $R_{23}$ are each independently a $C_1$-$C_{10}$ alkyl or $C_1$-$C_{10}$ haloalkyl group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2O$]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, m and n are each independently an integer from 0 to 4, and p is an integer of 0 or 1.

10. The laminate structure according to claim 1, wherein the flexible substrate layer is formed of at least one curable polymer resin selected from the group consisting of polyethylene terephthalate (PET), polyethylene sulfone (PES), polyethylene naphthalate (PEN), polycarbonate (PC), polymethylmethacrylate (PMMA), polyimide (PI), polyetherimide (PEI), polyamideimide, polyester, ethylene vinyl acetate (EVA), polyether amide imide, polyester amide imide, polyarylate (PAR), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolefin polymers (COPs), cycloolefin copolymers (COCs), dicyclopentadiene (DCPD) polymers, cyclopentadiene (CPD) polymers, polydimethylsiloxane (PDMS), silicone resins, fluoride resins, and modified epoxy resins.

11. A method for producing a flexible substrate with a metal wiring layer, comprising, (1) forming the laminate structure of claim 1, and (2) separating the flexible substrate with the metal wiring layer from the debonding layer and the carrier substrate by applying a physical stimulus such that the cross-sections of the metal wiring layer and the flexible substrate are exposed without causing chemical changes in the debonding layer.

12. The method according to claim 11, wherein the physical stimulus is selected from cutting, laser cutting, and diamond scribing.

13. The method according to claim 11, wherein the debonding layer has a thickness of 0.05 to 5 µm.

14. The method according to claim 11, wherein the metal wiring layer comprises a plurality of metal wires and the flexible substrate layer surrounds the metal wires and is in contact with the debonding layer to embed the metal wires therein.

15. The method according to claim 14, wherein the metal wires are arranged at intervals of 0.05 to 50 mm.

16. The method according to claim 11, wherein when the adhesion strengths of the debonding layer to the metal wiring layer before and after application of the physical stimulus are defined as A1 and A2, respectively, the ratio A2/A1 is from 0.001 to 0.5.

17. The method according to claim 11, wherein the debonding layer has a peel strength not greater than 0.3 N/cm from the metal wiring layer after application of the physical stimulus.

18. The method according to claim 11, wherein the debonding layer has an adhesion strength of at least 1 N/cm to the metal wiring layer before application of the physical stimulus.

19. An electronic device comprising a flexible substrate with a metal wiring layer produced by the method according to claim 11.

20. The method of claim 11, wherein the forming step includes forming the debonding layer on a carrier substrate, forming the metal wiring layer on the debonding layer, and coating a curable polymer on the metal wiring layer formed on the debonding layer to form a flexible substrate layer.

* * * * *